US011389991B2

(12) United States Patent
Toyoda

(10) Patent No.: US 11,389,991 B2
(45) Date of Patent: Jul. 19, 2022

(54) METHOD FOR SLICING WORKPIECE

(71) Applicant: SHIN-ETSU HANDOTAI CO., LTD., Tokyo (JP)

(72) Inventor: Shiro Toyoda, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 508 days.

(21) Appl. No.: 16/495,632

(22) PCT Filed: Mar. 6, 2018

(86) PCT No.: PCT/JP2018/008451
§ 371 (c)(1),
(2) Date: Sep. 19, 2019

(87) PCT Pub. No.: WO2018/186087
PCT Pub. Date: Oct. 11, 2018

(65) Prior Publication Data
US 2020/0016791 A1 Jan. 16, 2020

(30) Foreign Application Priority Data

Apr. 4, 2017 (JP) .............................. JP2017-074779

(51) Int. Cl.
*B28D 5/04* (2006.01)
*B23D 57/00* (2006.01)

(52) U.S. Cl.
CPC .......... *B28D 5/045* (2013.01); *B23D 57/0007* (2013.01)

(58) Field of Classification Search
CPC ................ B28D 5/045; B28D 57/0007; B28D 57/0023; B28D 57/0069

(Continued)

(56) References Cited

U.S. PATENT DOCUMENTS

2012/0298090 A1* 11/2012 Ohya ................... B24B 27/0633
125/16.02
2013/0061842 A1 3/2013 Junge et al.
(Continued)

FOREIGN PATENT DOCUMENTS

CN 107775828 A * 3/2018 ......... B24B 27/0633
JP H11-028654 A 2/1999
(Continued)

OTHER PUBLICATIONS

May 15, 2018 International Search Report issued in International Patent Application No. PCT/JP2018/008451.
(Continued)

*Primary Examiner* — Joseph J Hail
*Assistant Examiner* — J Stephen Taylor
(74) *Attorney, Agent, or Firm* — Oliff PLC

(57) ABSTRACT

A method for slicing a workpiece with a wire saw which includes a wire row formed by winding a fixed abrasive grain wire having abrasive grains secured to a surface thereof around a plurality of grooved rollers, the wire being fed from one of a pair of wire reels and taken up by another, the method including feeding a workpiece to the row for slicing while allowing the wire to reciprocate and travel in an axial direction, thereby slicing the workpiece at a plurality of positions aligned in an axial direction of the workpiece simultaneously. Prior to slicing, an abrasive-grain abrading step wherein the wire is allowed to travel without slicing the workpiece, allowing the wire to rub against itself within the reels, and dressing its surface for 30 minutes or more. The method can dress a fixed abrasive grain wire at low cost and suppress thickness unevenness of wafers.

8 Claims, 2 Drawing Sheets

(58) Field of Classification Search
USPC .......................................................... 125/21
See application file for complete search history.

(56) References Cited

U.S. PATENT DOCUMENTS

2015/0298228 A1   10/2015  Huggenberger et al.
2018/0215074 A1*   8/2018  Tanaka .................. B24D 11/00

FOREIGN PATENT DOCUMENTS

| JP | 2005-095993 A |   | 4/2005 |             |
|----|---------------|---|--------|-------------|
| JP | 2011-020197 A |   | 2/2011 |             |
| JP | 2013-058751 A |   | 3/2013 |             |
| JP | 2015-074037 A |   | 4/2015 |             |
| JP | 2016-500341 A |   | 1/2016 |             |
| JP | 2017080849 A  | * | 5/2017 | B24B 27/0633 |

OTHER PUBLICATIONS

Oct. 17, 2019 Intenational Preliminary Report on Patentability issued in International Patent Application No. PCT/JP2018/008451.

* cited by examiner

[FIG. 1]
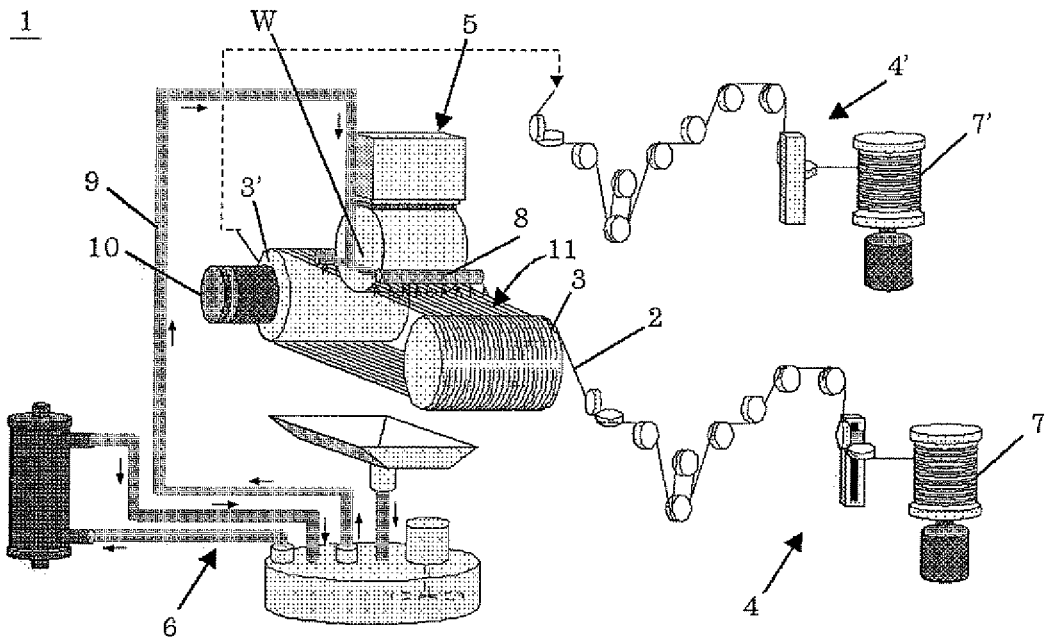
[FIG. 2]
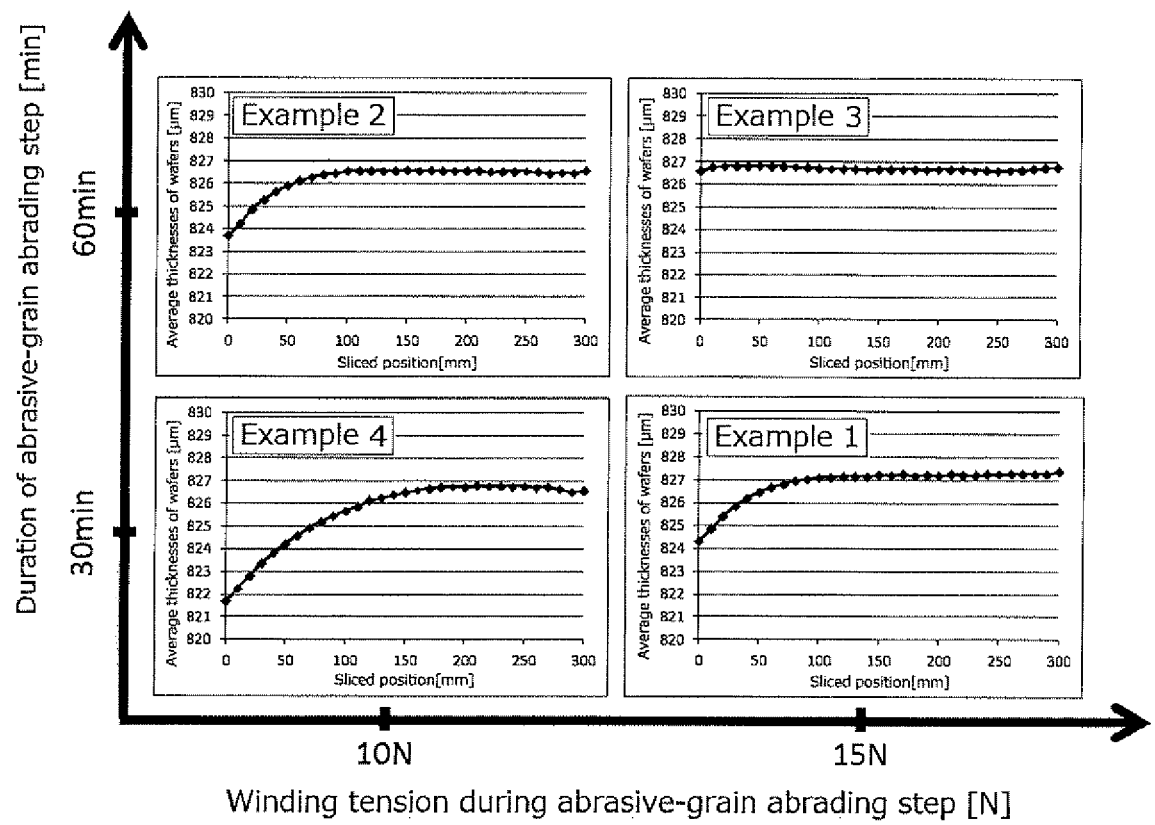

[FIG. 3]
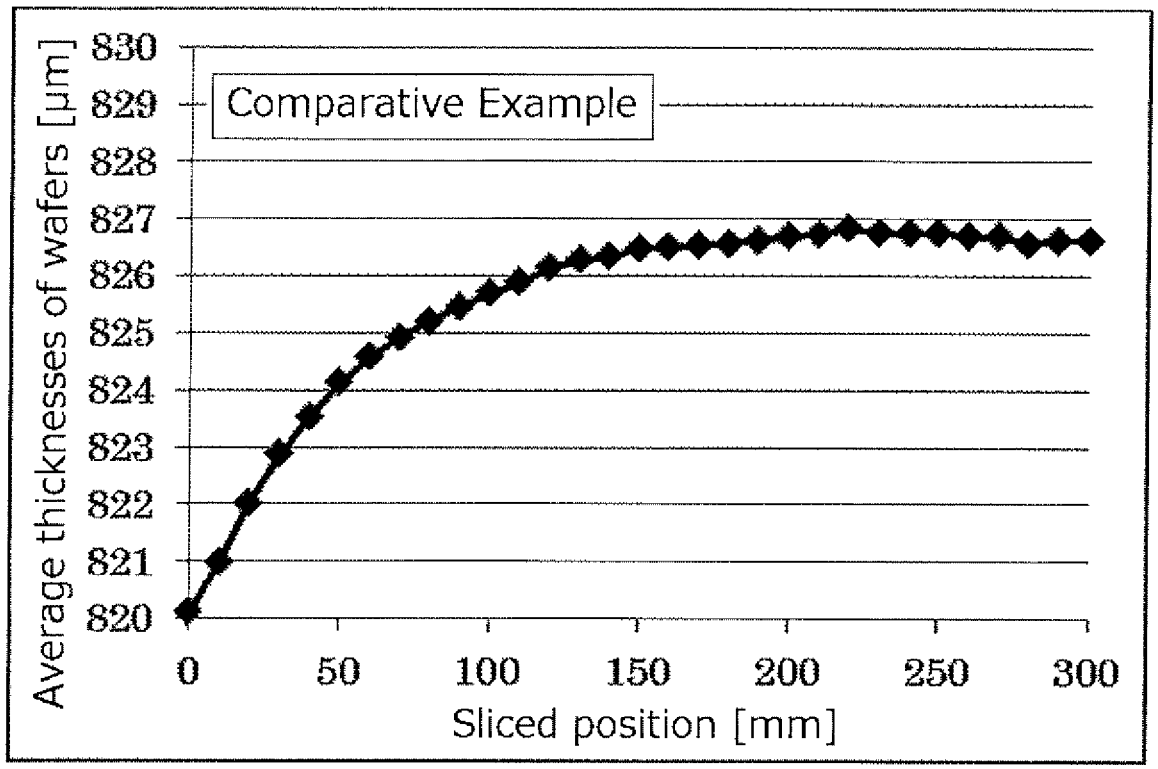
[FIG. 4]
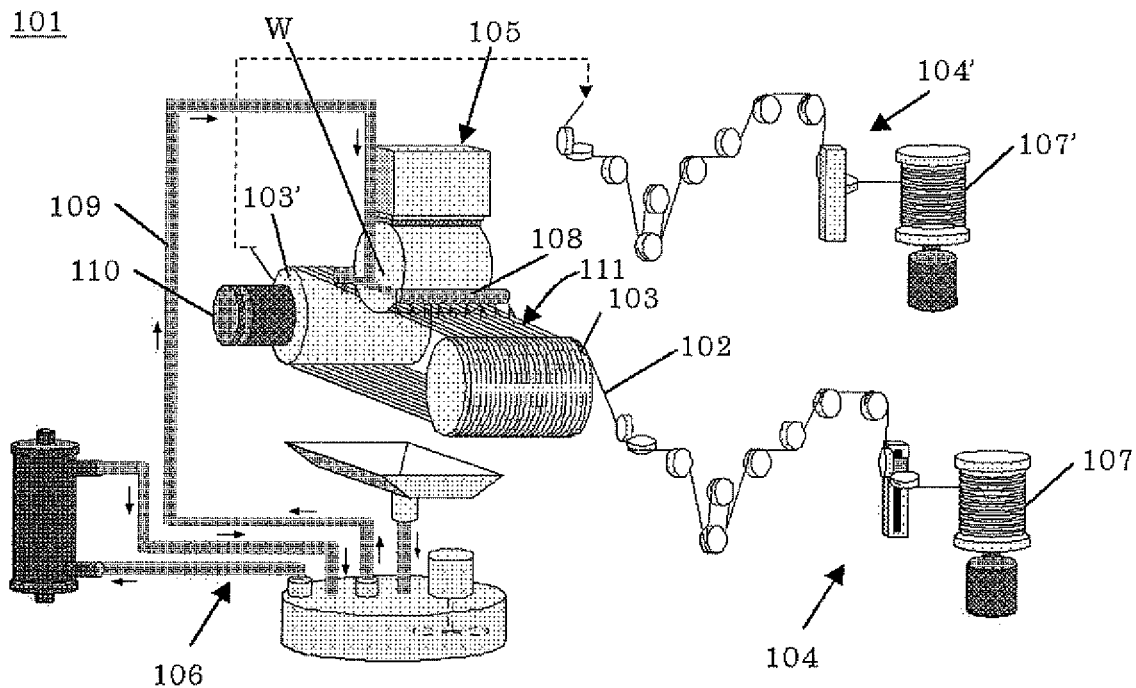

METHOD FOR SLICING WORKPIECE

TECHNICAL FIELD

The present invention relates to a method for slicing a workpiece.

BACKGROUND ART

As a means for slicing off wafers from a workpiece such as a silicon ingot or a compound semiconductor ingot, there has been conventionally known a wire saw which includes a fixed abrasive grain wire having abrasive grains secured to a surface thereof. In the fixed abrasive grain type wire saw, a wire row is formed by winding a fixed abrasive grain wire for slicing around a plurality of rollers in many turns, the fixed abrasive grain wire is driven in an axial direction thereof at a high speed, and a workpiece is fed to the wire row for slicing, while a processing liquid is being supplied appropriately, whereby this workpiece is sliced at wire positions simultaneously.

Here, FIG. 4 shows an outline of an example of a general wire saw which uses a fixed abrasive grain wire. As shown in FIG. 4, this fixed abrasive grain type wire saw 101 is mainly constituted of a fixed abrasive grain wire 102, which is a wire (a high tensile steel wire) with abrasive grains secured to a surface thereof, for slicing a workpiece W, grooved rollers 103 and 103' having the fixed abrasive grain wire 102 wound therearound, a wire row 111 formed by winding the fixed abrasive grain wire 102 around the grooved rollers 103 and 103', mechanisms 104 and 104' for imparting tension to the fixed abrasive grain wire 102, a means 105 for feeding the workpiece W to be sliced downward, and a mechanism 106 for supplying a cooling liquid 109 (also referred to as a coolant) during the slicing.

The fixed abrasive grain wire 102 is fed from one wire reel 107, and reaches the grooved roller 103 through the tension imparting mechanism 104. The fixed abrasive grain wire 102 is wound around the grooved rollers 103 and 103' in approximately 300 to 400 turns, and then taken up by a wire reel 107' through the other tension imparting mechanism 104'.

Further, the grooved rollers 103 and 103' are rollers provided by press-fitting a polyurethane resin around a cylinder made of steel and forming grooves on a surface thereof at a fixed pitch, and are configured in such a manner that the wound fixed abrasive grain wire 102 can be driven in a reciprocating direction in a predetermined cycle by a driving motor 110.

It is to be noted that, when the workpiece W is sliced, the workpiece W is held and pushed relatively down by the workpiece feed means 105, and fed to the wire row 111, which is formed from the fixed abrasive grain wire 102 wound around the grooved rollers 103 and 103'. Here, appropriate tension is applied to the fixed abrasive grain wire 102 by the wire tension imparting mechanism 104, the cooling liquid 109 is supplied through nozzles 108 while the fixed abrasive grain wire 102 travels in the reciprocating direction by the driving motor 110, and the workpiece W is fed for slicing by the workpiece feed means 105, thereby slicing the workpiece W into wafers. Further, after the slicing of the workpiece W has been completed, the sliced workpieces are extracted from the wire row 111 by relatively moving the sliced workpieces in the opposite direction to that when the workplace W is sliced.

CITATION LIST

Patent Literature

Patent Document 1: Japanese Unexamined Patent Application Publication No. 2005-95993
Patent Document 2: Japanese Unexamined Patent Application Publication No. H11-28654

SUMMARY OF INVENTION

Technical Problem

A fixed abrasive grain type wire saw as described above has a disadvantage that the thickness of the wafer at a portion sliced first is small, thereby increasing the thickness unevenness (TTV: Total Thickness Variation) of the wafer because the abrasive grains on the surface of the fixed abrasive grain wire are initially considerably worn at the start of the workpiece slicing, and because the wire vibrates in the axial direction of the workpiece due to insufficient sharpness of the abrasive grains. In order to suppress the fixed abrasive grain wire's initial wearing during the slicing and ensure enough sharpness to realize good quality of the wafers, the fixed abrasive grain wire needs to be appropriately dressed (sharpened) before beginning the slicing.

As the method for dressing a fixed abrasive grain wire before beginning the slicing, there have been known: a method in which an electrolytic bath is introduced into a wire saw apparatus for dressing by electrolytic reaction using conductive fluid (Patent Document 1); and a method in which dressing stones are incorporated into a wire saw apparatus for dressing (Patent Document 2). However, in the above methods of Patent Documents 1 and 2, it is necessary to design a new wire saw or remodel a conventional wire saw, and the preparations are not easy. Therefore, the conventional methods have problems of high cost or difficulty in implementation.

In view of the problems, it is an object of the present invention to provide a method for slicing a workpiece which is capable of easily dressing a fixed abrasive grain wire at low cost and suppressing thickness unevenness of wafers.

Solution to Problem

To achieve the object, the present invention provides a method for slicing a workpiece with a wire saw which comprises a wire row formed by winding a fixed abrasive grain wire having abrasive grains secured to a surface thereof around a plurality of grooved rollers, the fixed abrasive grain wire being fed from one of a pair of wire reels and taken up by another wire reel, the method comprising feeding a workpiece to the wire row for slicing while allowing the fixed abrasive grain wire to reciprocate and travel in an axial direction thereof, thereby slicing the workpiece at a plurality of positions aligned in an axial direction of the workpiece simultaneously, wherein the method comprises, before the slicing of the workpiece is begun, an abrasive-grain abrading step in which the fixed abrasive grain wire is allowed to travel without slicing the workpiece, thereby allowing the fixed abrasive grain wire to rub against itself within the wire reels, and dressing the surface of the fixed abrasive grain wire, and the abrasive-grain abrading step comprises dressing the surface of the fixed abrasive grain wire for 30 minutes or more.

Thus, by introducing the abrasive-grain abrading step with 30 minutes or more spent idling, the fixed abrasive grain wire is rubbed against itself within the wire reels, and the abrasive grains are dressed for enough time, so that the workpiece can be sliced with the fixed abrasive grain wire that has been dressed, thereby suppressing the thickness unevenness of the sliced wafers. Further, such a method can be carried out with an existing wire saw, and it is not necessary to design a wire saw newly or remodel a conventional wire saw, and therefore, the rising of costs can be suppressed, and the method can be carried out easily.

Here, in the abrasive-grain abrading step, when dressing the surface of the fixed abrasive grain wire, a winding tension of the fixed abrasive grain wire around the wire reels is preferably 15 N or more.

Thus, by setting the winding tension of the fixed abrasive grain wire around the wire reels to 15 N or more, the fixed abrasive grain wire can be rubbed against itself by a strong enough force within the wire reels, and the slicing can be started with the fixed abrasive grain wire that has been reliably dressed. Therefore, the thickness unevenness of the sliced wafers can be suppressed more.

Furthermore, in the abrasive-grain abrading step, when dressing the surface of the fixed abrasive grain wire, the surface of the fixed abrasive grain wire is preferably dressed for 60 minutes or more.

Thus, by making the duration of the abrasive-grain abrading step 60 minutes or more, the fixed abrasive grain wire can be rubbed against itself for a more sufficient time within the wire reels, and the slicing can be done with a fixed abrasive grain wire that has been more reliably dressed, and therefore, the thickness unevenness of the sliced wafers can be suppressed even more.

Further, in the abrasive-grain abrading step, when dressing the surface of the fixed abrasive grain wire, a wire travelling amount and a cycle time in the reciprocating travel of the fixed abrasive grain wire are preferably adjusted to dress the fixed abrasive grain wire by a necessary length for slicing the workpiece from a starting point of the slicing of the workpiece to a distance equivalent to 20% or more of a diameter of the workpiece.

Thus, by dressing the fixed abrasive grain wire by a necessary length for slicing the workpiece from the starting point of the slicing to a distance equivalent to at least 20% of the workpiece diameter, the fixed abrasive grain wire that has been reliably dressed can be used for slicing from the starting point of the slicing to a depth equivalent to the distance of about 20% of the diameter of the workpiece where the thickness is particularly liable to become uneven. Therefore, the thickness unevenness of the sliced wafers can be suppressed even more reliably.

Advantageous Effects of Invention

According to the inventive method for slicing a workpiece, a fixed abrasive grain wire can be dressed at low cost and easily, and the thickness unevenness of sliced wafers can be suppressed.

BRIEF DESCRIPTION OF DRAWINGS

FIG. 1 is a drawing showing an example of a wire saw that can be used in a workpiece slicing method of the present invention.

FIG. 2 shows graphs for illustrating average thicknesses of wafers according to the sliced position obtained in Examples 1 to 4.

FIG. 3 is a graph for illustrating average thicknesses of wafers according to sliced position obtained in Comparative Example.

FIG. 4 is a drawing showing an example of a general wire saw.

DESCRIPTION OF EMBODIMENTS

Embodiments of the present invention will be described hereinafter, but the present invention is not restricted thereto.

As described above, slicing a workpiece with a fixed abrasive grain type wire saw has a disadvantage that the thickness of a wafer at a portion sliced first is small, thereby increasing the thickness unevenness of the wafer because the abrasive grains on the surface of an unused fixed abrasive grain wire are initially considerably worn, and because the fixed abrasive grain wire vibrates in an axial direction of the workpiece due to insufficient sharpness of the abrasive grains, for example. Further, to counter this disadvantage, such a fixed abrasive grain wire has been dressed, but this means providing a wire saw with a new dressing mechanism, and therefore causes problems of higher cost and complication of the slicing step.

Accordingly, the present inventor has repeatedly conducted the earnest examination to solve these problems. Consequently, the inventor has found out that the thickness unevenness of wafers can be suppressed by introducing an abrasive-grain abrading step in which a fixed abrasive grain wire is allowed to travel without slicing a workpiece before the slicing of the workpiece is begun, thereby allowing the fixed abrasive grains to rub against themselves within wire reels and dressing the surface of the fixed abrasive grain wire, thereby bringing the present invention to completion.

Firstly, an example of a wire saw that can be used in the inventive workpiece slicing method will be explained with reference to FIG. 1. As shown in FIG. 1, a wire saw 1 mainly includes: a fixed abrasive grain wire 2 for slicing a workpiece W; a plurality of grooved rollers 3 and 3' with the fixed abrasive grain wire 2 wound therearound; a wire row 11 formed between the plurality of grooved rollers 3 and 3'; tension imparting mechanisms 4 and 4' for imparting tension to the fixed abrasive grain wire 2; a workpiece feed means 5 capable of feeding the workpiece W for slicing into the wire row 11 while holding the workpiece W to be sliced, the workpiece feed means 5 also being capable of moving the workpiece W relatively in an opposite direction to a direction in which the workpiece W is fed for slicing; and a cooling liquid supply mechanism 6 equipped with nozzles 8 for supplying a cooling liquid 9 during slicing.

Further, the wire saw 1 includes a pair of wire reels 7 and 7'. The fixed abrasive grain wire 2 is fed from the wire reel 7, and reaches the grooved roller 3 through the tension imparting mechanism 4. The fixed abrasive grain wire 2 is wound around the grooved rollers 3 and 3' in approximately 300 to 400 turns, and then taken up by the wire reel 7' through the other tension imparting mechanism 4'. As the fixed abrasive grain wire 2, a piano wire with nickel-electro deposited diamond abrasive grains on the surface can be used, for example.

Further, the grooved rollers 3 and 3' are rollers provided by press-fitting a polyurethane resin around a cylinder made of steel and forming grooves on a surface thereof at a fixed pitch, and are configured in such a manner that the fixed abrasive grain wire 2 wound around the rollers can reciprocally travel in an axial direction in a predetermined cycle by a driving motor 10.

Next, the inventive workpiece slicing method will be described using, as an example, a case where the wire saw 1 as in FIG. 1 is used. In the inventive slicing method, before the workpiece W is fed into the wire row 11 by the workpiece feed means 5 for slicing (that is, before the slicing of the workpiece W is begun), an abrasive-grain abrading step is performed for 30 minutes or more, in which the fixed abrasive grain wire 2 is allowed to travel without slicing the workpiece W. This allows the fixed abrasive grain wire 2 to rub against itself within the wire reels 7 and 7', dressing the surface of the fixed abrasive grain wire 2. By allowing the fixed abrasive grain wire 2 to reciprocate and travel in the axial direction for 30 minutes or more before the slicing of the workpiece W is begun, the fixed abrasive grain wire 2 wound around and in the wire reels 7 and 7' is rubbed against itself, and the abrasive grains secured to the surface of the fixed abrasive grain wire 2 are dressed. This makes it possible to suppress the thickness unevenness of the sliced workpieces W that are collected as wafers. Further, this method is simple, and since there is no particular need to provide a new dressing mechanism etc., the cost can be kept low.

Here, when dressing is performed during the abrasive-grain abrading step, the winding tension of the fixed abrasive grain wire 2 around the wire reels 7 and 7' is preferably 15 N or more. Thus, by setting the winding tension of the fixed abrasive grain wire 2 to 15 N or more, the fixed abrasive grain wire 2 can be rubbed against itself by a strong enough force within the wire reels 7 and 7', and the workpiece W can be sliced with the fixed abrasive grain wire 2 that has been reliably dressed. Therefore, the thickness unevenness of the wafers that are collected after the slicing can be suppressed more reliably. It is to be noted that it is preferable to set the winding tension to 30 N or less in order to prevent disconnection of the fixed abrasive grain wire 2.

Further, when dressing is performed during the abrasive-grain abrading step, the abrasive-grain abrading step is preferably carried out for 60 minutes or more. Thus, by dressing for 60 minutes or more during the abrasive-grain abrading step, the fixed abrasive grain wire 2 can be rubbed against itself for a sufficient time within the wire reels 7 and 7', and the workpiece W can be sliced with the fixed abrasive grain wire 2 that has been reliably dressed. This makes it possible to more reliably suppress the thickness unevenness of the sliced workpieces W that are collected as wafers. It is to be noted that, although no upper limit of the duration of the step is specified, it is a waste of time to carry on the step for very long time. Therefore, the duration is preferably within 5 hours.

Further, when dressing is performed during the abrasive-grain abrading step, it is preferable to adjust a wire travelling amount and a cycle time (time in which the fixed abrasive grain wire is switched between advance and retreat) in the reciprocating travel of the fixed abrasive grain wire 2 to dress the fixed abrasive grain wire 2 by a necessary length for slicing the workpiece W from a starting point of the slicing of the workpiece W to a distance equivalent to at least 20% of a diameter of the workpiece W. Thus, the fixed abrasive grain wire that has been reliably dressed can be used for slicing from the starting point of the slicing to a depth equivalent to the distance of about 20% of the workpiece W's diameter where the thickness is particularly liable to become uneven. Therefore, the thickness unevenness of the sliced workpieces W that are collected as sliced wafers can be suppressed even more.

After the abrasive-grain abrading step as described above, by feeding the workpiece W into the wire row 11 for slicing with the fixed abrasive grain wire 2 reciprocating and travelling in the axial direction of the wire, the workpiece W is sliced at a plurality of positions aligned in an axial direction of the workpiece W simultaneously. As the workpiece W to be sliced, a silicon single crystal ingot, a compound semiconductor ingot, or the like may be used, for example.

EXAMPLES

The present invention will be more specifically described hereinafter with reference to Examples and Comparative Example of the present invention, but the present invention is not restricted to these Examples.

Examples 1 to 4

A wire saw as shown in FIG. 1 was used to slice a workpiece in accordance with the workpiece slicing method of the present invention. As the workpieces to be sliced, columnar silicon single crystal ingots each with a diameter of about 300 mm were used. In addition, as the fixed abrasive grain wire used for slicing, a fixed abrasive grain wire with diamond abrasive grains secured to the core wire by electrodeposition of nickel as shown in Table 1 below was used.

TABLE 1

| | |
|---|---|
| Core wire diameter | 0.140 mm |
| Diamond abrasive grain | 10 to 20 μm |
| Wire outer diameter (nominal) | 0.174 mm |
| Abrasive grain securing method | Electrodeposition of nickel |

Further, the conditions of the abrasive-grain abrading step of each Example and the workpiece slicing conditions after the abrasive-grain abrading step are as shown in Table 2 below. Among Examples 1 to 4, the winding tension of the fixed abrasive grain wire around the reels during the abrasive-grain abrading step and the duration of the abrasive-grain abrading step were changed. On the other hand, the workpiece slicing conditions were not changed.

TABLE 2

| | | Example 4 | Example 1 | Example 2 | Example 3 | Comparative Example |
|---|---|---|---|---|---|---|
| Workpiece | Diameter | | | 301 mm | | |
| Grooved rollers | Roller pitch | | | 1001 μm | | |
| Wire travelling conditions during abrasive-grain abrading step | Wire tension | | | 25 N | | None |
| | Winding tension around reels | 10 N | 15 N | 10 N | 15 N | |
| | Dressing duration | 30 min | | 60 min | | |
| | Wire travelling rate | | | Up to 1500 m/min | | |
| | Wire advancing amount | | | 1800 m | | |
| | Wire retreating amount | | | 1800 m | | |

TABLE 2-continued

| | | Example 4 | Example 1 | Example 2 | Example 3 | Comparative Example |
|---|---|---|---|---|---|---|
| Wire travelling conditions during slicing | Wire tension | | | 25 N | | |
| | Wire travelling rate | | | Up to 1500 m/min | | |
| | Wire advancing amount | | | 2114 m | | |
| | Wire retreating amount | | | 2086 m | | |
| | Amount of wire used | | | 9000 m | | |
| Workpiece feeding condition during slicing | Average workpiece feeding rate | | | 0.32 mm/min | | |
| Cooling water | Liquid type | | | Mixture of water and glycol | | |
| | Coolant flow rate | | | 150 L/min | | |
| | Coolant temperature | | | 23° C. | | |

The workpiece was sliced under the above conditions, and the average thickness of the sliced wafers in a slicing direction in each of Examples 1 to 4 was plotted (FIG. 2).

Comparative Example

A workpiece was sliced without the abrasive-grain abrading step, using the same fixed abrasive grain wire used in Examples 1 to 4 and shown in Table 1. The other workpiece slicing conditions were the same as those in Examples 1 to 4 shown in Table 2. After the slicing, the average thickness of the sliced wafers in the slicing direction was plotted as in Examples 1 to 4 (FIG. 3).

As can be seen from FIGS. 2 and 3, in all Examples, the thickness unevenness of the wafers was smaller than that in Comparative Example. Thus, it has been verified that, according to the workpiece slicing method of the present invention, 30 minutes or more of idling enables low-cost and easy dressing of a fixed abrasive grain wire, and successfully suppresses thickness unevenness of the wafers.

In particular, it was observed that when the winding tension in the abrasive-grain abrading step was changed from 10 N in Example 4 to 15 N in Example 1, the thickness unevenness was suppressed further. In addition, it was observed that when the duration of the dressing in the abrasive-grain abrading step was changed from 30 minutes in Example 4 to 60 minutes in Example 2, the thickness unevenness in the slicing direction was suppressed further. Furthermore, it was observed that when both the winding tension and the duration in the abrasive-grain abrading step were changed from 10 N to 15 N and from 30 minutes to 60 minutes respectively in Example 3, the thickness unevenness in the slicing direction was remarkably suppressed.

It should be noted that the present invention is not limited to the above-described embodiments. The embodiments are just examples, and any examples that have substantially the same features and demonstrate the same functions and effects as those in the technical concept disclosed in claims of the present invention are included in the technical scope of the present invention.

The invention claimed is:

1. A method for slicing a workpiece with a wire saw which comprises a wire row formed by winding a fixed abrasive grain wire having abrasive grains secured to a surface thereof around a plurality of grooved rollers, the fixed abrasive grain wire being fed from one of a pair of wire reels and taken up by another wire reel, the method comprising feeding a workpiece to the wire row for slicing while allowing the fixed abrasive grain wire to reciprocate and travel in an axial direction thereof, thereby slicing the workpiece at a plurality of positions aligned in an axial direction of the workpiece simultaneously,
   wherein the method comprises, before the slicing of the workpiece is begun, an abrasive-grain abrading step in which the fixed abrasive grain wire is allowed to travel without slicing the workpiece, thereby allowing the fixed abrasive grain wire to rub against itself within the wire reels, and dressing the surface of the fixed abrasive grain wire, and
   the abrasive-grain abrading step comprises dressing the surface of the fixed abrasive grain wire for 30 minutes or more.

2. The method for slicing a workpiece according to claim 1,
   wherein, in the abrasive-grain abrading step, when dressing the surface of the fixed abrasive grain wire, a winding tension of the fixed abrasive grain wire around the wire reels is 15 N or more.

3. The method for slicing a workpiece according to claim 2,
   wherein, in the abrasive-grain abrading step, when dressing the surface of the fixed abrasive grain wire, a wire travelling amount and a cycle time in the reciprocating travel of the fixed abrasive grain wire are adjusted to dress the fixed abrasive grain wire by a necessary length for slicing the workpiece from a starting point of the slicing of the workpiece to a distance equivalent to 20% or more of a diameter of the workpiece.

4. The method for slicing a workpiece according to claim 2,
   wherein, in the abrasive-grain abrading step, when dressing the surface of the fixed abrasive grain wire, the surface of the fixed abrasive grain wire is dressed for 60 minutes or more.

5. The method for slicing a workpiece according to claim 4,
   wherein, in the abrasive-grain abrading step, when dressing the surface of the fixed abrasive grain wire, a wire travelling amount and a cycle time in the reciprocating travel of the fixed abrasive grain wire are adjusted to dress the fixed abrasive grain wire by a necessary length for slicing the workpiece from a starting point of the slicing of the workpiece to a distance equivalent to 20% or more of a diameter of the workpiece.

6. The method for slicing a workpiece according to claim 1,
   wherein, in the abrasive-grain abrading step, when dressing the surface of the fixed abrasive grain wire, the surface of the fixed abrasive grain wire is dressed for 60 minutes or more.

7. The method for slicing a workpiece according to claim 6,
   wherein, in the abrasive-grain abrading step, when dressing the surface of the fixed abrasive grain wire, a wire travelling amount and a cycle time in the reciprocating travel of the fixed abrasive grain wire are adjusted to dress the fixed abrasive grain wire by a necessary length for slicing the workpiece from a starting point of the slicing of the workpiece to a distance equivalent to 20% or more of a diameter of the workpiece.

8. The method for slicing a workpiece according to claim 1,
wherein, in the abrasive-grain abrading step, when dressing the surface of the fixed abrasive grain wire, a wire travelling amount and a cycle time in the reciprocating travel of the fixed abrasive grain wire are adjusted to dress the fixed abrasive grain wire by a necessary length for slicing the workpiece from a starting point of the slicing of the workpiece to a distance equivalent to 20% or more of a diameter of the workpiece.

* * * * *